United States Patent

Urushido

(10) Patent No.: US 7,176,568 B2
(45) Date of Patent: Feb. 13, 2007

(54) SEMICONDUCTOR DEVICE AND ITS MANUFACTURING METHOD, ELECTRONIC MODULE, AND ELECTRONIC UNIT

(75) Inventor: Tatsuhiro Urushido, Sakata (JP)

(73) Assignee: Seiko Epson Corporation (JP)

( * ) Notice: Subject to any disclaimer, the term of this patent is extended or adjusted under 35 U.S.C. 154(b) by 282 days.

(21) Appl. No.: 10/973,989

(22) Filed: Oct. 26, 2004

(65) Prior Publication Data

US 2005/0110049 A1    May 26, 2005

(30) Foreign Application Priority Data

Oct. 27, 2003    (JP) .............................. 2003-366080

(51) Int. Cl.
- *H01L 23/52* (2006.01)
- *H01L 23/48* (2006.01)
- *H01L 23/40* (2006.01)
- *H01L 23/04* (2006.01)
- *H01L 23/495* (2006.01)
- *H01L 21/50* (2006.01)
- *H01L 21/48* (2006.01)

(52) U.S. Cl. .................. 257/735; 257/736; 257/730; 257/778; 257/E23.039; 438/108; 438/106

(58) Field of Classification Search ................ 257/686, 257/701, 729–730, 735–737, 723–725, 773, 257/778, E23.039; 438/106, 108
See application file for complete search history.

(56) References Cited

U.S. PATENT DOCUMENTS 6,208,521 B1 * 3/2001 Nakatsuka ................. 361/749
6,507,106 B1 * 1/2003 Hogerl ....................... 257/723
6,683,377 B1 * 1/2004 Shim et al. ................. 257/723
6,841,855 B2 * 1/2005 Jaeck et al. ................ 257/668

FOREIGN PATENT DOCUMENTS

| JP | 56-169568 | 5/1965 |
| JP | 61-117266 | 7/1986 |
| JP | 08-116140 | 5/1996 |
| JP | 11-144403 | 5/1999 |
| JP | 2002-026082 | 1/2002 |
| JP | 2002-289984 | 10/2002 |
| JP | 2003-051648 | 2/2003 |
| JP | 2004-207704 | 7/2004 |

OTHER PUBLICATIONS

Communication from Japanese Patent Office re: counterpart application, May 9, 2005.

* cited by examiner

*Primary Examiner*—Luan Thai
(74) *Attorney, Agent, or Firm*—Harness, Dickey & Pierce, P.L.C.

(57) ABSTRACT

A semiconductor device is provided having: a board; a metallization pattern formed on the first face of the board; a first layer formed so as to not cover the first portion of the metallization pattern but to cover the second portion; and a semiconductor chip mounted on the first face of the board and electrically connected with the metallization pattern in the first portion. A resin portion is provided between the semiconductor chip and the board and from there onto the first portion of the metallization pattern outside the semiconductor chip so as to not reach a boundary between the first and second portions. A second layer is provided on the second face of the board so as to overlap the boundary of the metallization pattern and not overlap the resin portion.

12 Claims, 2 Drawing Sheets

SEMICONDUCTOR DEVICE AND ITS MANUFACTURING METHOD, ELECTRONIC MODULE, AND ELECTRONIC UNIT

RELATED APPLICATIONS

This application claims priority to Japanese Patent Application No. 2003-366080 filed Oct. 27, 2003 which is hereby expressly incorporated by reference herein in its entirety.

BACKGROUND

1. Technical Field

The present invention relates to a semiconductor device, a semiconductor device manufacturing method, an electronic module, and an electronic unit.

2. Background Art

In the COF (Chip On Film) mounting procedure, a film is used. On the film, a metallization pattern is formed; a solder-resist is formed on the metallization pattern so as to expose a part of the metallization pattern. The film can be freely bent and as such, a semiconductor device can be made smaller. When the film is bent, a stress is prone to be concentrated in the boundary of the metallization pattern with respect to the border of the solder-resist. Therefore, there has been a need to prevent the metallization pattern from being broken by such stress concentration.

An object of the invention is to prevent the metallization pattern from being broken.

SUMMARY

A semiconductor device according to the invention includes:
- a board having first and second faces facing in mutually opposite directions;
- a metallization pattern having first and second continued portions, and formed on the first face of the board;
- a first layer formed so as to cover the second portion of the metallization pattern and expose the first portion;
- a semiconductor chip mounted on the first face of the board and electrically connected with the metallization pattern in the first portion;
- a resin portion provided between the semiconductor chip and the board and extending onto the first portion of the metallization pattern outside the semiconductor chip and terminating prior to a boundary between the first and second portions; and
- a second layer provided on the second face of the board so as to overlap the boundary of the metallization pattern and not overlap the resin portion.

According to the invention, the second layer overlaps the boundary between the first and second portions of the metallization pattern (or the boundary with respect to the border of the first layer, i.e., a portion where a stress is prone to be concentrated) to reinforce the portion and as such, the metallization pattern is restrained from being broken. In addition, the resin portion does not reach the boundary (which is a portion that is easy to bend) between the first and second portions of the metallization pattern and therefore the resin portion is restrained from being damaged by the bending of the metallization pattern. Furthermore, because the second layer does not overlap the resin portion, the bending of the board is allowed between the second layer and the resin portion.

In the semiconductor device, the second layer may overlap the first layer.

In the semiconductor device, the second layer may be formed so that a portion thereof which overlaps the boundary has a maximum thickness.

In the semiconductor device, the second layer may be composed of a resin.

In the semiconductor device, at least one of the first and second layers may be a solder-resist layer.

In the semiconductor device, the second layer may be formed from a material that is more flexible than materials of the resin portion and first layer.

In the semiconductor device, the resin portion may be formed from a material that is harder than materials of the first and second layers.

An electronic module according to the invention has: the semiconductor device; and
  an electronic panel with the semiconductor device installed therein.

An electronic unit according to the invention has the semiconductor device.

A method of manufacturing a semiconductor device according to the invention includes the steps of:
- mounting a semiconductor chip on a first face of a board, the board having a metallization pattern formed on the first face, the metallization pattern having first and second continued portions, the board having a first layer formed on the first face so as to cover the second portion of the metallization pattern and expose the first portion;
- electrically connecting the semiconductor chip with the metallization pattern in the first portion of the metallization pattern;
- providing a resin portion between the semiconductor chip and the board and extending onto the first portion of the metallization pattern outside the semiconductor chip and terminating prior to a boundary between the first and second portions; and
- providing a second layer on a second face opposite the first face of the board so as to overlap the boundary of the metallization pattern and not overlap the resin portion.

According to the invention, the second layer overlaps the boundary between the first and second portions of the metallization pattern (or the boundary with respect to the border of the first layer, i.e., a portion where a stress is prone to be concentrated) to reinforce the portion and as such, the metallization pattern is restrained from being broken. In addition, the resin portion does not reach the boundary (which is a portion that is easy to bend) between the first and second portions of the metallization pattern and therefore the resin portion is restrained from being damaged by the bending of the metallization pattern. Furthermore, because the second layer does not overlap the resin portion, the bending of the board is allowed between the second layer and the resin portion.

In the method of manufacturing a semiconductor device, the second layer may be provided so as to overlap the first layer.

In the method of manufacturing a semiconductor device, the second layer may be formed so that a portion thereof which overlaps the boundary has a maximum thickness.

DETAILED DESCRIPTION

Figure 1:
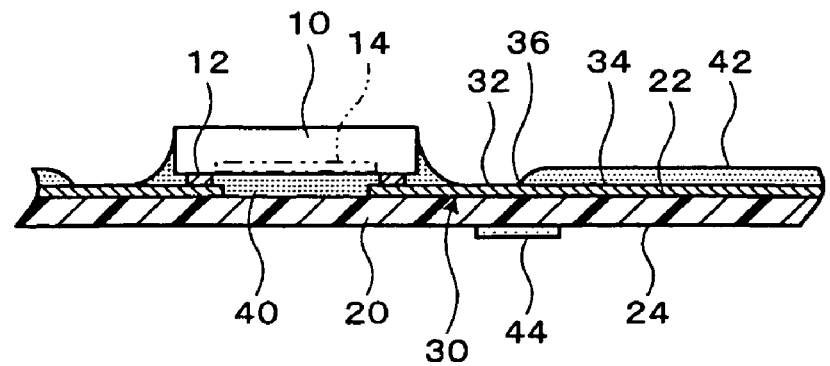
FIG. 1 is a view to assist explaining a semiconductor device according to an embodiment of the invention.
Figure 2:
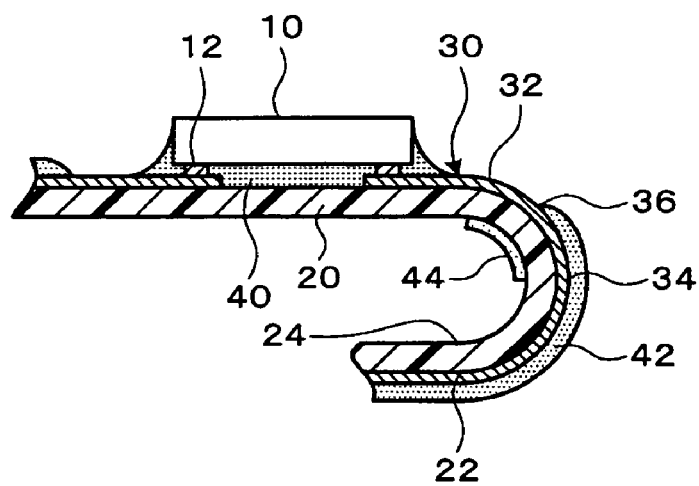
FIG. 2 is a view showing the semiconductor device illustrated in FIG. 1 with its board bent.

Embodiments of the invention will be described below with reference to the drawings. FIG. 1 is a view to assist explaining a semiconductor device according to an embodiment of the invention. FIG. 2 is a view showing the semiconductor device illustrated in FIG. 1 with its board bent.

The semiconductor device has a semiconductor chip 10. The semiconductor chip 10 has one or more electrodes 12. (The number of the electrodes is two or more in the case of the example illustrated in FIG. 1). Each of the electrodes 12 may include a pad and a bump thereon. The electrode 12 is arranged in an end portion of the semiconductor chip 10. (When the semiconductor chip 10 has a rectangular shape, electrodes are arranged in end portions along two opposed sides thereof or peripheral end portions along four sides thereof.) The electrode 12 is electrically connected with an inside portion of the semiconductor chip 10. An integrated circuit 14 is built in the semiconductor chip 10 (e.g., in the surface where the electrode 12 is formed). All or some of the electrodes 12 are electrically connected with the integrated circuit 14.

The semiconductor device has a board (e.g., a film) 20. The board 20 may be a length of tape. The board 20 may be made from a resin such as polyimide. The board 20 has the property of flexing and therefore it may be referred to as a flexible board. The board 20 has first and second faces 22 and 24, which face (point) in mutually opposite directions. The distance between the first and second faces 22, 24 represents the thickness of the board 20.

A metallization pattern 30 is formed on the board 20 (more specifically, on the first face 22 thereof). The metallization pattern 30 is formed by a conductive material (e.g., a metal such as copper). The entire metallization pattern 30 overlaps the board 20. The metallization pattern 30 may be entirely attached to (or stuck to or placed in close contact with) the board 20. The metallization pattern 30 may be glued on the board 20 through an adhesive, or may be directly deposited on the board 20. The metallization pattern 30 is used for electrical connection in one semiconductor device. Therefore, when a single board (e.g., a length of tape) 20 is used to manufacture a collection (or an assembly) of a plurality of semiconductor devices, a plurality of metallization patterns 30 are formed on the single board 20. The metallization pattern 30 has a plurality of metallization lines (parts for electrically connecting a plurality of points), and it may have a plurality of lands (which are parts used for electrical connection with other components and have a larger width than the metallization lines). The metallization pattern 30 (or e.g., a metallization line thereof) has first and second portions 32 and 34. The first and second portions 32 and 34 are continued portions. The first and second portions 32 and 34 may extend linearly or may be bent.

The semiconductor chip 10 is mounted on the board 20 (more specifically on the first face 22 thereof). The semiconductor chip 10 may overlap the first portion 32 of the metallization pattern 30. The semiconductor chip 10 may be arranged so as to not overlap the second portion 34 of the metallization pattern 30.

The semiconductor chip 10 may be electrically connected with the metallization pattern 30. The electrical connection is ensured by the first portion 32 of the metallization pattern 30. In the case where the semiconductor chip 10 is arranged so that the face with electrodes 12 formed thereon is opposed to the board 20 (i.e., the chip is subjected to face-down bonding), the electrodes 12 are opposed to the metallization pattern 30 (or to the first portion 32 thereof). Between the electrodes 12 and the metallization pattern 30 (or the first portion 32 thereof), inter-metallic joining may be conducted, or electro-conductive particles may be interposed. As an alternative, the semiconductor chip 10 may be arranged so that the face with electrodes 12 formed thereon faces (points) in the opposite direction to the board 20, and the electrodes 12 and metallization pattern 30 (or the first portion 32 thereof) may be bonded through wires or the like.

A resin portion 40 is formed between the semiconductor chip 10 and the board 20. The resin portion 40 is formed by a resin such as epoxy. The resin portion 40 is filled in a space between the semiconductor chip 10 and the board 20. The resin portion 40 may seal electrical connections between the electrodes 12 and metallization pattern 30 and absorb stresses created in the electrical connections. The resin portion 40 extends to the outside of the semiconductor chip 10. The resin portion 40 reaches above the first portion 32 of the metallization pattern 30, while it does not reach above the second portion 34. The resin portion 40 does not reach the boundary 36 between the first and second portions 32 and 34 of the metallization pattern 30. There may be a distance (space) left between the border (leading end or edge) of the resin portion 40 and the boundary 36. In other words, the resin portion 40 may be arranged so as to not be placed on the portion that is continued from the boundary 36 of the first portion 32.

The resin portion 40 never reaches the boundary 36 (which is a portion that is easy to bend as described later) of the first and second portions 32 and 34 of the metallization pattern and as such, the resin portion 40 is prevented or restrained from being damaged by the bending of the board 20 and the metallization pattern 30.

A first layer 42 is formed on the board 20 (more specifically on the first face 22 thereof). The first layer 42 is an insulating layer; the first layer may be formed from a resin or may be composed of a solder-resist layer. The first layer 42 covers the second portion 34 of the metallization pattern 30, but it does not cover the first portion 32. In other words, a portion of the metallization pattern 30, which is covered by the first layer 42, makes the second portion 34, and a portion exposed from the first layer 42 makes the first portion 32. The resin portion 40 is arranged so as to not be placed on the first layer 42.

A second layer 44 is formed on the board 20 (more specifically, on the second face 24 thereof). The second layer 44 is an insulating layer; the second layer may be formed from a resin or may be composed of a solder-resist layer. Alternatively, the second layer 44 may be a board of a film or the like; the second layer may be stuck to the board 20 by an adhesive or may be directly deposited on the board 20.

The second layer 44 overlaps the boundary 36 between the first and second portions 32 and 34 of the metallization pattern 30. When the metallization pattern 30 is bent, a stress is prone to be concentrated in the boundary 36, because the second portion 34 of the metallization pattern 30 is reinforced with the first layer 42 and the first portion 32 is not reinforced with the first layer 42. In the embodiment, the second layer 44 overlaps the boundary 36 and as such, the portion where a stress is prone to be concentrated is reinforced and thus the metallization pattern 30 is prevented or restrained from being broken.

The second layer 44 overlaps the second portion 34 of the metallization pattern 30 (or first layer 42). Thus, the boundary 36 can be reliably reinforced. The second layer 44 does not overlap the resin portion 40. Accordingly, the bending of the metallization pattern 30 (or board 20) can be allowed between the second layer 44 and the resin portion 40. The second layer 44 may be formed from a material more flexible than the resin portion 40 and first layer 42. The resin portion 40 may be formed from a material harder than the first and second layers 42 and 44.

A method of manufacturing a semiconductor device according to the embodiment includes mounting a semiconductor chip 10 on the first face 22 of the board 20. Details of the board 20 can be derived from the above description. The board 20 may be arranged so that the first layer 42 is already formed on the board 20 at the time of mounting the semiconductor chip 10. The semiconductor chip 10 is electrically connected with the metallization pattern 30 in the first portion 32 of the metallization pattern 30. In the case where face down bonding is applied, electrical connection between the semiconductor chip 10 and metallization pattern 30 may be completed at the time when the mounting of the semiconductor chip 10 has been completed.

The method of manufacturing a semiconductor device according to the embodiment includes forming the resin portion 40. Details of the resin portion 40 can be derived from the above description. The resin portion 40 may be formed by filling a space between the semiconductor chip 10 and the board 20 with a resin after the semiconductor chip 10 is mounted on the board 20. In this case, the resin is an underfill material.

Alternatively, a resin as an adhesive may be interposed between the semiconductor chip 10 and the board 20 to mount the semiconductor chip 10 on the board 20. The resin portion 40 can be formed by extruding the resin from under the semiconductor chip 10 when the semiconductor chip 10 is mounted. In this case, at the time when the mounting of the semiconductor chip 10 has been completed, electrical connection between the semiconductor chip 10 and metallization pattern 30 and the formation of the resin portion 40 may be also completed. The resin as an adhesive may be an insulating resin. In the case where the resin contains electroconductive particles, the resin can be used for electrical connection.

The method of manufacturing a semiconductor device according to the embodiment includes providing the second layer 44 on the second face 24 of the board 20. Details of the second layer 44 can be derived from the above description. The second layer 44 may be provided before the semiconductor chip 10 is mounted on the board 20, before the semiconductor chip 10 and metallization pattern 30 are electrically connected, or before the resin portion 40 is formed. Alternatively, the second layer 44 may be provided after the semiconductor chip 10 has been mounted on the board 20, after the semiconductor chip 10 and metallization pattern 30 have been electrically connected, or after the resin portion 40 has been formed.

Other details concerning the method of manufacturing a semiconductor device according to the embodiment include what can be derived from arrangements for the above-described semiconductor device.

Figure 3:
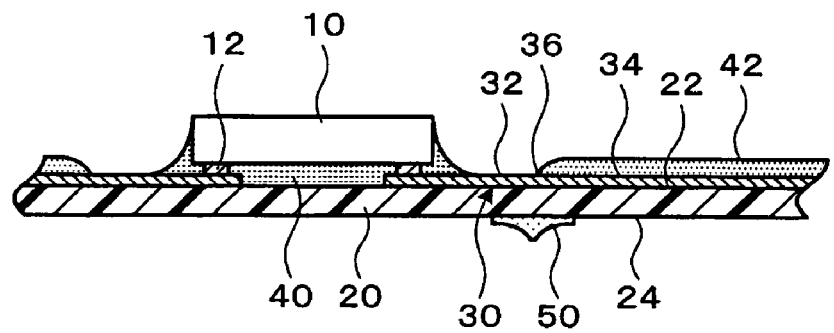
FIG. 3 is a view to assist explaining an alternative of the semiconductor device according to the embodiment of the invention.
Figure 4:
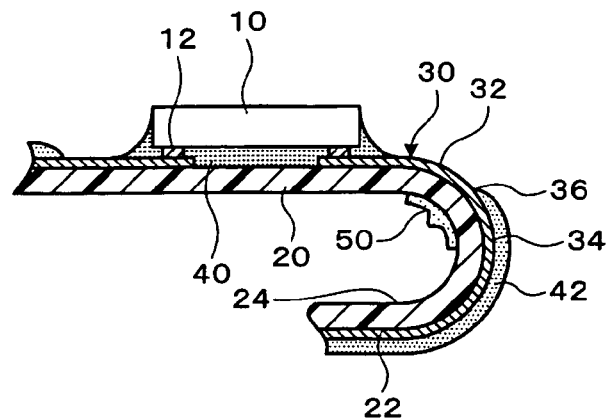
FIG. 4 is a view showing the semiconductor device illustrated in FIG. 3 with its board bent.

FIG. 3 is a view of assistance in explaining an alternative of the semiconductor device according to the embodiment of the invention. FIG. 4 is a view showing the semiconductor device illustrated in FIG. 3 with its board bent. In the example shown in FIG. 3, the second layer 50 is formed so that a portion of the second layer which overlaps the boundary 36 between the first and second portions 32 and 34 of the metallization pattern 30 has a maximum thickness. This makes a portion of the second layer 50 with the maximum thickness (i.e., a portion with the highest performance of reinforcement) overlap a portion (i.e., the boundary 36) of the metallization pattern 30 where a stress is the most prone to be concentrated and as such the robustness of the metallization pattern 30 is improved. Other arrangements correspond to what has been described in the above embodiment.

Figure 5:
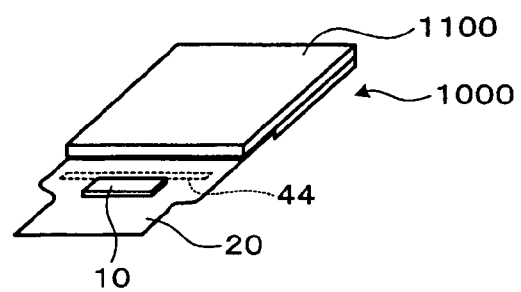
FIG. 5 is a view to assist explaining an electronic module according to the embodiment.
Figure 6:
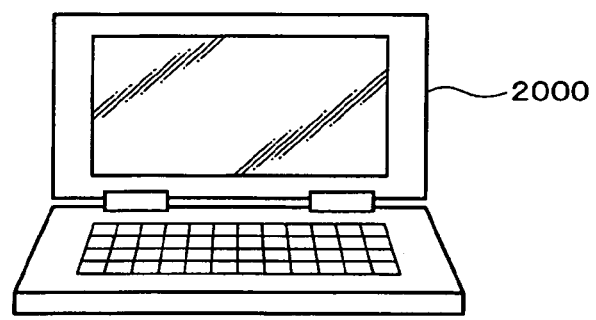
FIG. 6 is a view showing an electronic unit having a semiconductor device according to the embodiment.
Figure 7:
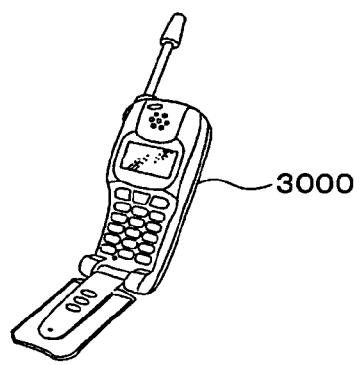
FIG. 7 is a view showing an electronic unit having a semiconductor device according to the embodiment.

FIG. 5 shows an electronic module 1000 according to an embodiment of the invention. The electronic module 1000 has the above-described semiconductor device and an electronic panel 1100 with the semiconductor device installed therein (e.g., a display panel such as a liquid crystal panel or an electroluminescence panel). More specifically, the board 20 of the semiconductor device is attached to the electronic panel 1100 and the metallization pattern 30 is electrically connected with the electronic panel 1100. As an electronic unit having the semiconductor device according to the embodiment of the invention, FIG. 6 shows a notebook-sized personal computer 2000 and FIG. 7 shows a cellular phone 3000.

The invention is not limited to the above-described embodiments and various modifications and changes may be made. For example, the invention may include an arrangement substantially identical to the arrangement described in any one of the embodiments (e.g., an arrangement identical in its function, way, and result, or an arrangement identical in objective and result). Also, the invention may include an arrangement wherein a nonessential part of the arrangement described in any one of the embodiments is replaced with another one. Further, the invention may include an arrangement which can produce the same effect and advantage as the arrangement described in any one of the embodiments can do or an arrangement which can achieve the same object. Still further, the invention may include an arrangement obtained by adding well-known art to the arrangement which has been described in any one of the embodiments. Moreover, the invention may include details left after any of technical respects described in any one of the above embodiments have been exclusively removed. Alternatively, the invention may include details left after a feature of the known art has been exclusively removed from any one of the foregoing embodiments.

What is claimed is:

1. A semiconductor device comprising:
   a board having first and second faces facing in mutually opposite directions;
   a metallization pattern formed on the first face of said board, the metallization pattern having first and second continued portions;
   a first layer covering the second portion of said metallization pattern and exposing the first portion;
   a semiconductor chip mounted on the first face of said board, the semiconductor chip being electrically connected with said metallization pattern in the first portion;

a resin portion provided between said semiconductor chip and said board and extending onto the first portion of said metallization pattern outside said semiconductor chip and terminating prior to a boundary between the first and second portions; and a second layer provided on the second face of said board so as to overlap the boundary of said metallization pattern and not overlap said resin portion.

2. The semiconductor device of claim 1, wherein said second layer overlaps said first layer.

3. The semiconductor device of claim 2, wherein a portion of said second layer which overlaps the boundary has a maximum thickness of said second layer.

4. The semiconductor device of claim 1, wherein said second layer comprises a resin.

5. The semiconductor device of claim 1, wherein at least one of said first and second layers comprises a solder-resist layer.

6. The semiconductor device of claim 1, wherein said second layer comprises a material having more flexibility than materials of said resin portion and first layer.

7. The semiconductor device of claim 1, wherein said resin portion comprises a material that is harder than materials of said first and second layers.

8. An electronic module comprising:
the semiconductor device of claim 1; and
an electronic panel with said semiconductor device installed therein.

9. An electronic unit comprising the semiconductor device of claim 1.

10. A method of manufacturing a semiconductor device comprising the steps of:

mounting a semiconductor chip on a first face of a board, the board having a metallization pattern formed on the first face, the metallization pattern having first and second continued portions, the board having a first layer formed on the first face covering the second portion of said metallization pattern and exposing the first portion;

electrically connecting said semiconductor chip with said metallization pattern in the first portion of said metallization pattern;

providing a resin portion between said semiconductor chip and said board and extending onto the first portion of said metallization pattern outside said semiconductor chip and terminating prior to a boundary between the first and second portions; and providing a second layer on a second face of said board opposite the first face so as to overlap the boundary of said metallization pattern and not overlap said resin portion.

11. The method of manufacturing a semiconductor device of claim 10, wherein said second layer is provided so as to overlap said first layer.

12. The method of manufacturing a semiconductor device of claim 11, wherein said second layer is formed so that a portion thereof which overlaps the boundary has a maximum thickness of said second layer.

* * * * *